(12) United States Patent
Azumai

(10) Patent No.: US 9,541,855 B2
(45) Date of Patent: Jan. 10, 2017

(54) SIGNAL PROCESSING DEVICE, SIGNAL PROCESSING METHOD, AND IMAGE FORMING APPARATUS

(71) Applicant: KONICA MINOLTA, INC., Chiyoda-ku, Tokyo (JP)

(72) Inventor: Mitsuo Azumai, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/686,349

(22) Filed: Apr. 14, 2015

(65) Prior Publication Data

US 2015/0338763 A1    Nov. 26, 2015

(30) Foreign Application Priority Data

May 22, 2014    (JP) .................................. 2014-106397

(51) Int. Cl.

| | |
|---|---|
| G03G 15/043 | (2006.01) |
| H03K 3/017 | (2006.01) |
| B41J 2/47 | (2006.01) |
| G03G 21/14 | (2006.01) |
| G02B 26/10 | (2006.01) |

(52) U.S. Cl.
CPC .............. *G03G 15/043* (2013.01); *B41J 2/47* (2013.01); *G03G 21/14* (2013.01); *H03K 3/017* (2013.01); *G02B 26/10* (2013.01)

(58) Field of Classification Search
CPC ................ G05F 1/40; H04N 5/91; B41J 2/47; G03G 15/043; H03K 3/017
See application file for complete search history.

(56) References Cited

U.S. PATENT DOCUMENTS

| | | |
|---|---|---|
| 6,512,534 B2 | 1/2003 | Koga et al. |
| 8,310,513 B2 | 11/2012 | Nihei et al. |
| 2003/0223523 A1* | 12/2003 | Takaki ...................... G06F 1/12 375/354 |

FOREIGN PATENT DOCUMENTS

| | | |
|---|---|---|
| JP | 2001221965 A | 8/2001 |
| JP | 2010194730 A | 9/2010 |

* cited by examiner

*Primary Examiner* — Sarah Al Hashimi
(74) *Attorney, Agent, or Firm* — Holtz, Holtz & Volek PC

(57) ABSTRACT

A signal processing device that generates an output signal from image data by using a clock corresponding to the pixels of the image data, the signal processing device includes: a delayed signal group generating unit that generates a group of delayed signals with a delay element group formed with stages of delay elements; a clock adjusting unit that generates a modulation/synchronization clock from the group of delayed signals by referring to phase data matching the clock with a predetermined phase and frequency modulation coefficient data converting the clock to a predetermined frequency; and a PWM processing unit that generates a PWM signal from the group of delayed signals by referring to the phase data, the frequency modulation coefficient data, the modulation/synchronization clock, and the image data, the PWM signal having a pulse width corresponding to the value of the image data.

9 Claims, 9 Drawing Sheets

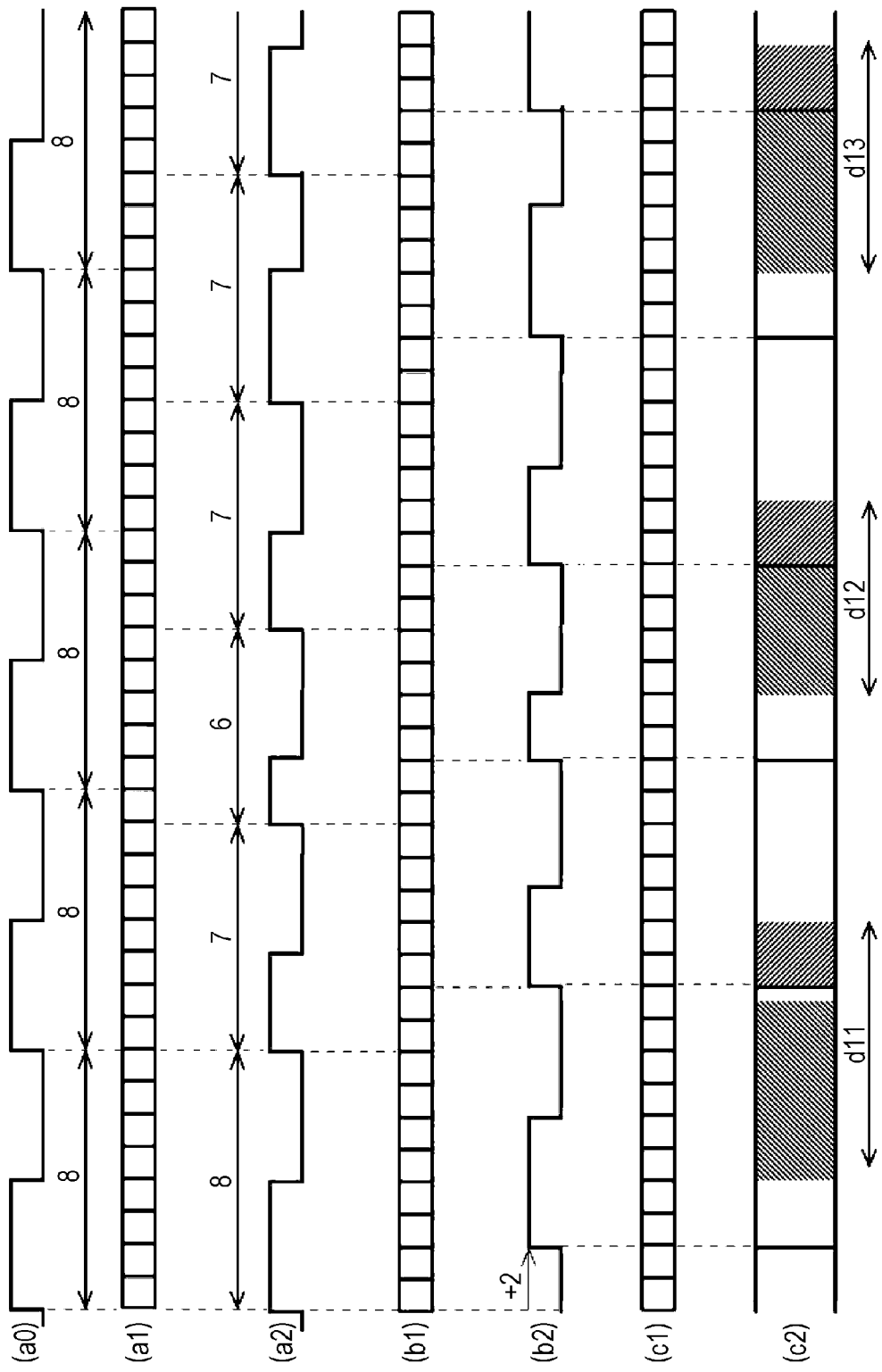

SIGNAL PROCESSING DEVICE, SIGNAL PROCESSING METHOD, AND IMAGE FORMING APPARATUS

The entire disclosure of Japanese Patent Application No. 2014-106397 filed on May 22, 2014 including description, claims, drawings, and abstract are incorporated herein by reference in its entirety.

BACKGROUND OF THE INVENTION

Field of the Invention

The present invention relates to a signal processing device that performs signal processing with an accuracy within one clock pulse, a signal processing method, and an image forming apparatus for performing signal processing and image formation with an accuracy within one clock pulse, using a group of delayed signals generated by a delay element group delaying a clock.

Description of the Related Art

A known image forming apparatus forms an image equivalent to one line or a few lines in the main scanning direction in accordance with image data, and also forms an image equivalent to one page by repeating, in the sub scanning direction, image formation of each line in the main scanning direction.

In the image formation in the main scanning direction in accordance with image data, positioning is performed based on a clock that serves as the reference clock for the pixels to be formed, or a clock called "pixel clock" or "dot clock".

For example, an electrophotographic image forming apparatus scans with a laser beam modulated in accordance with image data in the main scanning direction, and at the same time, forms an image with the laser beam on an image bearing member rotating in the sub scanning direction. In this case, the laser beam is modulated with the image data in synchronization with the above described clock.

There is a technique for performing signal processing such as a PWM process with an accuracy within one clock pulse by generating a group of delayed signals with a delay element group delaying the clock in a number of stages, and selecting a delayed signal pulse of a desired time from the group of delayed signals.

FIG. 6 shows a specific example where a signal processing circuit 1 that performs a PWM process with an accuracy within one clock pulse is used in an image forming apparatus.

The flowchart in FIG. 7 shows operation of the signal processing circuit 1. FIG. 8 is a timing chart showing states of various kinds of signals to be processed by the signal processing circuit 1.

A clock generating unit 5 generates the reference clock (reference CLK) at a frequency suitable for forming an image of an originally intended size (step S11 in FIG. 7). Specifically, an image of an originally intended size can be formed by arranging a predetermined number of dots with PWM signals generated with the reference clock (reference CLK) used as the pixel clock.

Here, the clock frequency needs to be adjusted by several percent through adjustment of the size of the images to be formed on the front and back of a paper sheet or partial magnification of images for various kinds of distortion correction or the like. So as to adjust the position of an image on a paper sheet, the clock phase needs to be adjusted in some cases.

A frequency modulating unit 10 generates a modulation clock by minutely adjusting (changing) the frequency of the reference clock. In this case, a delay element group 12 generates a group of delayed signals by minutely delaying the phase of the reference clock (step S14 in FIG. 7). For example, the delay element group 12 delays the pulse of one cycle of the divided reference clock by approximately ¹⁄₁₀₀ stage, to generate the group of delayed signals. A selecting unit 16 selects a suitable delayed signal from the group of delayed signals, so that the modulation clock having the frequency of the reference clock changed by ±1% can be generated.

A delay amount measuring unit 13 can measure the delay time in one stage of the group of delayed signals based on how many stages of the delayed signals are equivalent to one cycle of the reference clock (step S15 in FIG. 7). In this case, the reference clock is as accurate as crystal oscillation. Accordingly, even if the delay time of the group of delayed signals changes due to temperature or time, it is possible to recognize the delay time.

Frequency modulation coefficient data indicating to what extent the reference clock is to be changed is supplied from outside (step S12 in FIG. 7), and a timing calculating unit 14 refers to the delay time measured by the delay amount measuring unit 13 with respect to one stage of the group of delayed signals, and calculates the necessary number of stages of delayed signals for changing the reference clock to a desired frequency (step S16 in FIG. 7). The selecting unit 16 selects an optimum delayed signal pulse from the group of delayed signals, and outputs the selected pulse as the modulation clock (step S17 in FIG. 7).

For example, an instruction to increase the frequency of a 50 MHz reference clock by 4% is given as the frequency modulation coefficient data. In this case, the number of stages of delayed signals to be selected from the group of delayed signals is gradually changed, so that a modulation clock of 52 MHz, which is 4% higher than 50 MHz as desired, is generated.

Here, "modulation" is not the same as modulation in communications (multiplication of carrier waves by information), but means a change in the frequency of a clock. As suitable delayed signals are selected from the group of delayed signals in generating the modulation clock, it is difficult to accurately obtain a 52 MHz modulation clock. The frequency fluctuates up and down, and a mean frequency of 52 MHz is eventually obtained.

The modulation clock is then input to a synchronizing unit 20 in the next stage. This synchronizing unit 20 has the same circuit configuration as that of the above described frequency modulating unit 10. In this synchronizing unit 20, the phase and the position of the pulse with respect to the modulation clock are changed in accordance with data supplied from outside, and a synchronization clock is generated.

In this case, a delay element group 22 generates a group of delayed signals by minutely delaying the phase of the modulation clock (step S18 in FIG. 7). For example, the delay element group 22 delays the pulse of one cycle of the reference clock by approximately ¹⁄₁₀₀ stage, to generate the group of delayed signals. A selecting unit 26 selects a suitable delayed signal from the group of delayed signals, so that the phase of the modulation clock can be changed by ±1%, and a synchronization clock synchronized with a predetermined phase can be generated. Here, the synchronization clock is generated so as to be synchronized with sensor data and phase data that are input from outside.

In this synchronizing unit 20 operating in the same manner as the frequency modulating unit 10 described above, sensor data and phase data that indicate with which phase the reference clock is to be synchronized are supplied from outside (step S12 in FIG. 7), and a timing calculating unit 24 refers to the delay time measured (step S19 in FIG. 7) by a delay amount measuring unit 23 with respect to one stage of the group of delayed signals, and calculates the necessary number of stages of delayed signals for synchronizing the modulation clock with a desired phase (step S20 in FIG. 7). The selecting unit 26 selects an optimum delayed signal pulse from the group of delayed signals, and outputs the selected pulse as the synchronization clock (step S21 in FIG. 7).

The synchronization clock is then input to a PWM processing unit 30 in the next stage. This PWM processing unit 30 has almost the same circuit configuration as those of the frequency modulating unit 10 and the synchronizing unit 20 described above. Here, a PWM signal having a pulse width in accordance with the value of image data is generated from the synchronization clock.

In this case, a delay element group 32 generates a group of delayed signals by minutely delaying the phase of the synchronization clock (step S22 in FIG. 7). For example, the delay element group 32 delays the pulse of one cycle of the reference clock by approximately 1/100 stage, to generate the group of delayed signals. A selecting unit 36 selects a suitable delayed signal from the group of delayed signals, so that a PWM signal having a leading edge and a trailing edge selected by ±1% can be generated. Here, a PWM signal is generated so as to have the pulse width corresponding to the value of image data that is input (step S13 in FIG. 7) from outside.

In the PWM processing unit 30 operating in the same manner as the frequency modulating unit 10 and the synchronizing unit 20 described above, a timing calculating unit 34 refers to the delay time measured (step S23 in FIG. 7) by a delay amount measuring unit 33 with respect to one stage of the group of delayed signals and the value of image data, and calculates the number of stages of delayed signals having the necessary edges (leading and trailing edges) for generating a PWM signal of a desired pulse width (step S24 in FIG. 7). A pulse generating unit 36 then selects an optimum delayed signal pulse from the group of delayed signals based on a result of the calculation, and generates the PWM signal (step S25 in FIG. 7).

In accordance with the pulse width of the PWM signal to be generated by the pulse generating unit 36, a dividing unit 31 is provided on the input side of the delay element group 32, and divides the synchronization clock. So as to adjust the timing of the image data to the synchronization clock at the time of the calculation by the timing calculating unit 34, a synchronizing unit 35 synchronizes the image data with the synchronization clock.

In FIG. 8, a group of delayed signals (a1) is generated from the reference clock (a0), desired delayed signals are selected, and the modulation clock (a2) is generated. Here, the reference clock is equivalent to eight pulses of the delayed signals, and the modulation clock is equivalent to seven pulses of the delayed signals. A group of delayed signals (b1) is also generated from the modulation clock (a2), desired delayed signals are selected, and the synchronization clock (b2) is generated. A group of delayed signals (c1) is further generated from the synchronization clock (b2), desired delayed signals are selected, and the PWM signal (c2) is generated. Here, the PWM signal (c2) is generated in a case where the following situation is repeated three times: pixel value=70%, position=right-adjusted, pixel value=30%, and position=left-adjusted.

Relationships between clock synchronization and image data are disclosed in JP 2001-221965 A and JP 2010-194730 A, for example.

In the example described above with reference to FIGS. 6 to 8, the clock frequency can be adjusted in accordance with adjustment of the size of the images to be formed on the front and back of a paper sheet and partial magnification of an image, and the phase of the clock for adjusting the position of an image on a paper sheet can be adjusted.

However, the timing chart shown in FIG. 8 shows an ideal state, and might differ from a state in reality (as shown in the timing chart in FIG. 9, for example).

In FIG. 9, a group of delayed signals (a1) is generated from the reference clock (a0), desired delayed signals are selected, and the modulation clock (a2) is generated.

Here, the reference clock is designed to be equivalent to eight pulses of the delayed signals, and the modulation clock is designed to be equivalent to seven pulses of the delayed signals.

However, when the modulation clock is generated through selection of desired delayed signals from the group of delayed signals, the leading edge or the trailing edge of the modulation clock can be changed only once in one pulse of the reference clock. Therefore, in the example shown in FIG. 9, the number of selected pulses vary from eight pulses to seven pulses to six pulses, for example, with the average being seven pulses.

A group of delayed signals (b1) is also generated from the modulation clock (a2), desired delayed signals are selected, and the synchronization clock (b2) is generated. A group of delayed signals (c1) is further generated from the synchronization clock (b2), desired delayed signals are selected, and the PWM signal (c2) is generated.

In FIG. 9, the group of delayed signals (a1), the group of delayed signals (b1), and the group of delayed signals (c1) are delayed signal groups that are generated independently of one another. Therefore, the pulses appear to be the same in the schematic diagram in FIG. 9, but in practice, each pulse contains an error component.

Here, the PWM signal (c2) is generated in a case where the following situation is repeated three times: pixel value=70%, position=right-adjusted, pixel value=30%, and position=left-adjusted.

At a portion d11 of the PWM signal, there is a blank portion at the portion that is right-aligned and is 70% in pixel value. This is because, where the pixel value is 70%, one clock is assumed to be seven pulses, and the start is moved to the right by two pulses. In practice, however, one clock is eight pulses, and a blank portion equivalent to one pulse is formed at the right end portion.

At a portion d12 of the PWM signal, the portion that is right-aligned and is 70% in pixel value is smaller than the originally intended size. This is because, where the pixel value is 70%, one clock is assumed to be seven pulses, and the start is moved to the right by two pulses. In practice, however, one clock is six pulses, and therefore, the one pulse at the right end portion is left out. Having been subjected to the frequency modulation, the synchronizing process, and the PWM process as described above, the PWM signals based on the same image data do not have the same pulse widths as one another. This leads to image quality deterioration.

As is apparent from FIGS. 6 and 7, in the entire apparatus, the three delay element groups positioned in series generate the respective groups of delayed signals. As a result, delay variations that occur in the respective delay element groups accumulate.

If delay variations are completely random and do not have correlation with one another, the delay variations are not multiplied (three times) by the three stages in some cases. However, the same delay element groups are used in the same environments in this case. Therefore, delay variations in the same direction accumulate, and are predicted to actually lead to a large delay variation.

Since different frequencies and different phases are used in generating the modulation clock from the reference clock, generating the synchronization clock from the modulation clock, and generating the PWM signal from the synchronization clock, the respective delay element groups need to be provided independently of one another, and cannot be integrated into one delay element group.

Specifically, in a case where a group of delayed signals generated by a delay element group delaying the clock, and signal processing is performed with an accuracy within one clock pulse in the respective stages of the clock frequency modulation, the clock synchronization, and the PWM process, delay variations of the delay elements accumulate, leading to a large error. Due to the delay variations, the pulse widths of PWM signals (or densities in an image forming apparatus) vary, and image quality deterioration is caused.

Since a delay element group is required for each function, the circuit size becomes large. In a case where minute delay times are set so as to cope with high resolution, the circuit size of each delay element group becomes large, and therefore, the problem of circuit size becomes a very serious issue.

Although image densities in an image forming apparatus have been described as a specific example, the image densities can be regarded as signal values in a signal processing device.

Any of the above mentioned patent literatures cannot solve the above problem, and do not consider the above problem as a serious issue.

SUMMARY OF THE INVENTION

The present invention has been made to solve the above problem, and an object thereof is to realize a signal processing device, a signal processing method, and an image forming apparatus that do not have signal degradation due to accumulation of delay variations or the like when performing signal processing or image formation with an accuracy within one clock pulse, using a group of delayed signals generated by a delay element group delaying the clock.

The present invention will be described to solve the problem as follows.

(1) To achieve the abovementioned object, according to an aspect, a signal processing device that generates an output signal in accordance with image data using a clock corresponding to the pixels of the image data, the signal processing device reflecting one aspect of the present invention comprises: a delayed signal group generating unit that generates a group of delayed signals with a delay element group formed with stages of delay elements, the delay element group delaying the clock in stages within a time equivalent to one pulse of the clock; a clock adjusting unit that generates a modulation/synchronization clock from the group of delayed signals by referring to phase data matching the clock with a predetermined phase and frequency modulation coefficient data converting the clock to a predetermined frequency, the modulation/synchronization clock having its frequency and its synchronization state adjusted; and a PWM processing unit that generates a PWM signal from the group of delayed signals by referring to the phase data, the frequency modulation coefficient data, the modulation/synchronization clock, and the image data, the PWM signal having a pulse width corresponding to the value of the image data and being adjusted to the predetermined frequency while being synchronized with the predetermined phase.

(2) In Item. 1, the clock adjusting unit preferably generates the modulation/synchronization clock by selecting the delayed signals corresponding to the leading edge and the trailing edge of the modulation/synchronization clock from the group of delayed signals, and the PWM processing unit preferably generates the PWM signal by selecting the delayed signals corresponding to the leading edge and the trailing edge of the PWM signal from the group of delayed signals.

(3) In Items. 1 to 2, the delayed signal group generating unit preferably generates delay amount data indicating the delay time equivalent to one stage of the group of delayed signals based on how many stages of the group of delayed signals are equivalent to one cycle of the clock, and supplies the delay amount data together with the group of delayed signals to the clock adjusting unit and the PWM processing unit, the clock adjusting unit preferably selects desired delayed signals from the group of delayed signals and generates the modulation/synchronization clock by further referring to the delay amount data, and the PWM processing unit preferably selects desired delayed signals from the group of delayed signals and generates the PWM signal by further referring to the delay amount data.

(4) In Items. 1 to 3, the PWM processing unit preferably generates the PWM signal by referring to the image data synchronized with the modulation/synchronization clock.

(5) In Items. 1 to 4, the delayed signal group generating unit preferably generates the group of delayed signals by dividing the clock and delaying the divided clock with the delay element group including the stages of delay elements.

(6) An image forming apparatus preferably includes: the above signal processing device of any one of Items. 1 to 5; and an image forming unit that forms an image using the PWM signal generated by the signal processing device.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 9 is a timing chart for explaining signal processing in a conventional image forming apparatus.

DESCRIPTION OF THE PREFERRED EMBODIMENTS

Hereinafter, embodiments of a signal processing device, a signal processing method, and an image forming apparatus according to the present invention will be described in detail with reference to the drawings. However, the scope of the invention is not limited to the illustrated examples. In this description, a specific example is a signal processing device 100 to be used in an image forming apparatus that forms images through binary outputs.

[Structures of a Signal Processing Device and an Image Forming Apparatus]

Figure 1:
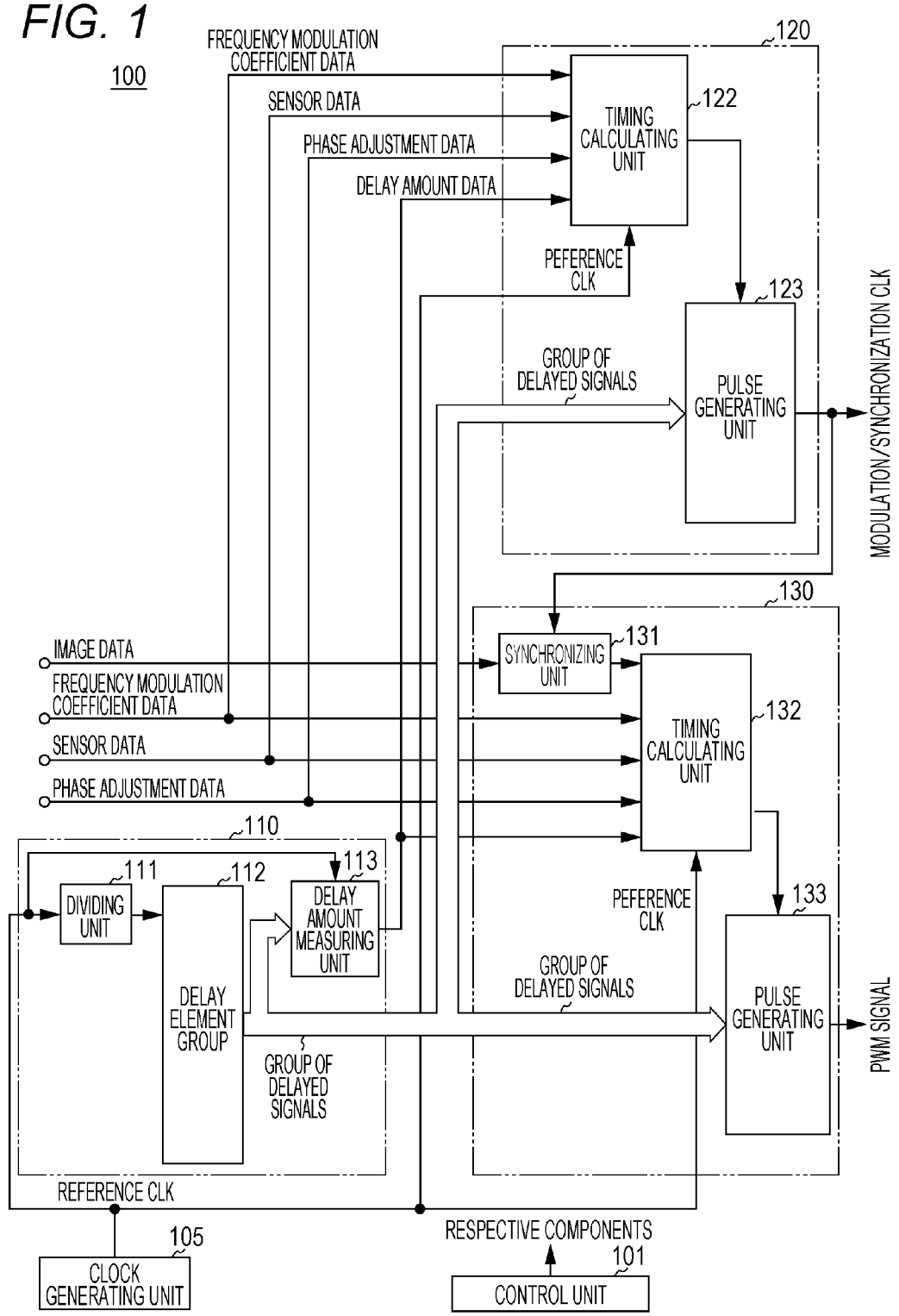
FIG. 1 is a diagram showing the structures of the main components in an embodiment of the present invention.
Figure 2:
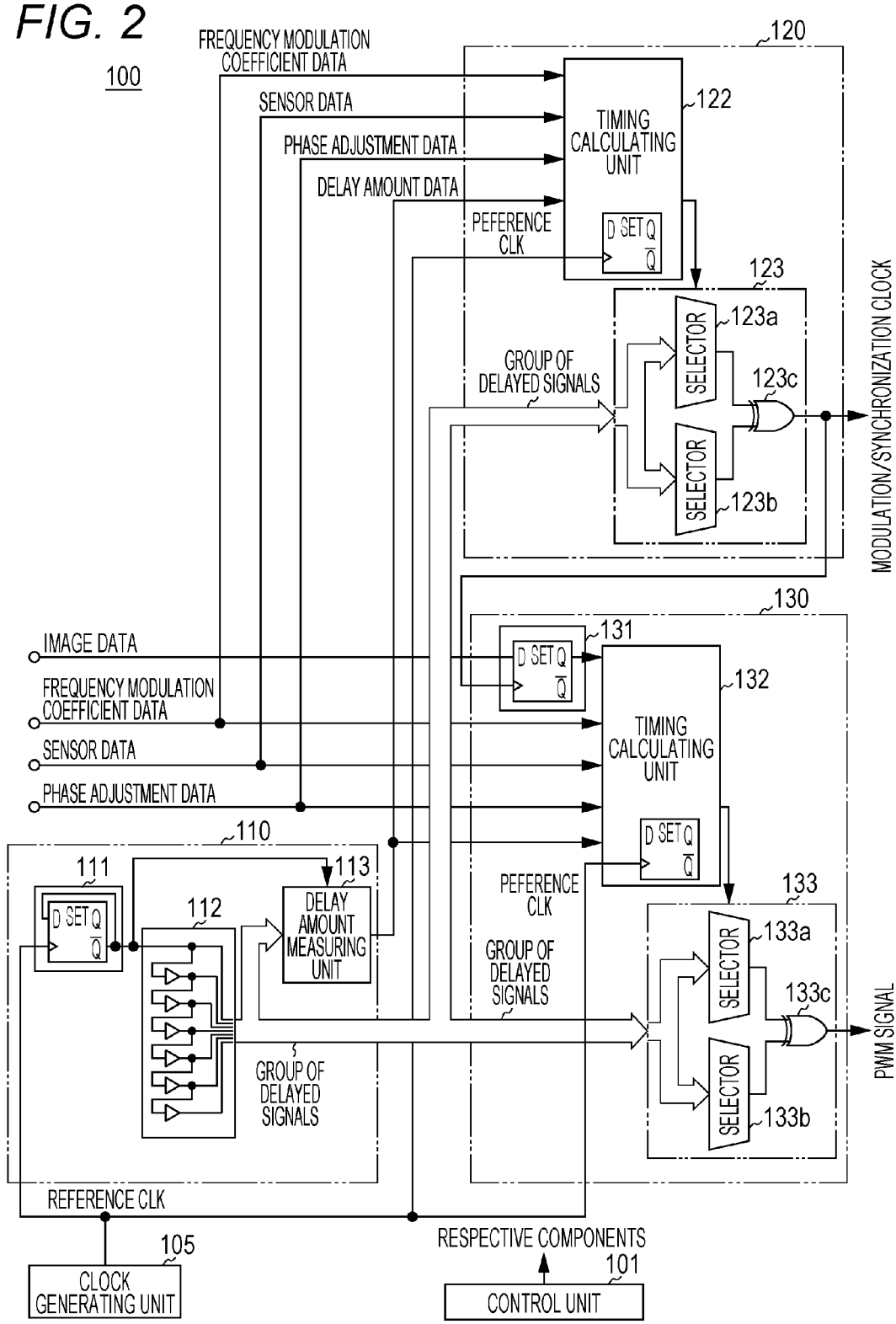
FIG. 2 is a diagram showing the structures of the main components in the embodiment of the present invention.
Figure 3:
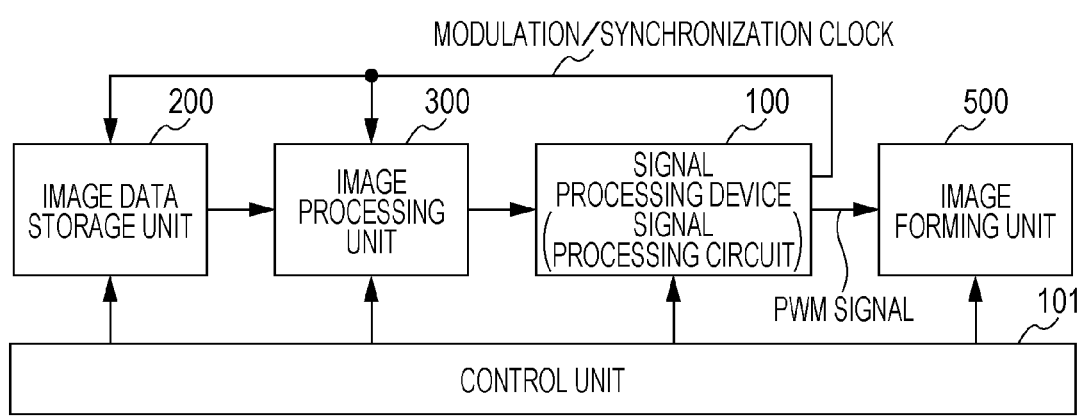
FIG. 3 is a diagram showing the structure of an image forming apparatus to which the embodiment of the present invention is applied.

Referring now to FIGS. 1 and 2, the structure of the signal processing device 100 that can be used for image formation is described in detail. FIG. 1 shows the respective components as functional blocks, and FIG. 2 shows a specific circuit to the greatest extent possible. However, this embodiment is not limited to the specific structure shown in FIG. 2. Referring also to FIG. 3, the structure of an image forming apparatus that uses the signal processing device 100 is described.

General components in the signal processing device 100 that are already known to the public and do not relate directly to characteristic operation and control of this embodiment will not be explained below.

The signal processing device 100 shown in FIG. 1 includes a control unit 101, a clock generating unit 105, a delayed signal group generating unit 110, a clock adjusting unit 120, and a PWM processing unit 130.

Image data indicating the values of respective pixels, frequency modulation coefficient data for converting the reference clock into a predetermined frequency, and phase data for matching the reference clock to a predetermined phase (the sensor data and the phase adjustment data shown in FIG. 1) are input to the signal processing device 100 via an external unit or the control unit 101.

The control unit 101 controls the respective components of the signal processing device 100. In a case where the signal processing device 100 is used in an image forming apparatus, the control unit 101 can also serve as the control unit of the image forming apparatus.

The clock generating unit 105 generates the reference clock that is to serve as the reference in the signal processing device 100, and supplies the reference clock to the respective components. In this embodiment, the "clock" means the reference clock.

The delayed signal group generating unit 110 has a delay element group 112 including delay elements arranged in a stepwise fashion, and, with the delay element group 112, generates a group of delayed signals that delay the clock stepwise within the time equivalent to one pulse of the clock. In this delayed signal group generating unit 110, the reference clock is divided by a dividing unit 111, and is then supplied to the delay element group 112. A delay amount measuring unit 113 generates delay amount data that indicates the delay time in one stage of the group of delayed signals based on how many stages of the delayed signals are equivalent to one cycle of the reference clock. Since the reference clock is as accurate as crystal oscillation, the delay time in one stage of the group of delayed signals can be accurately calculated from how many stages of the group of delayed signals are equivalent to one cycle of the reference clock.

The delayed signal group generating unit 110 supplies the group of delayed signals and the delay amount data to the clock adjusting unit 120 and the PWM processing unit 130. That is, the clock adjusting unit 120 and the PWM processing unit 130 use the same group of delayed signals obtained from the same delay element group 112, and are designed to perform parallel processing.

The clock adjusting unit 120 refers to the phase data (the sensor data and the phase adjustment data shown in FIG. 1), the frequency modulation coefficient data, the delay amount data, and the reference clock, and selects, from the group of delayed signals, the leading edge and the trailing edge of a modulation/synchronization clock having its frequency and frequency state adjusted. By doing so, the clock adjusting unit 120 generates the modulation/synchronization clock.

At this point, a timing calculating unit 122 determines the leading edge and the trailing edge of the modulation/synchronization clock by referring to the phase data, the frequency modulation coefficient data, the delay amount data, and the reference clock, and supplies the leading edge and the trailing edge of the modulation/synchronization clock as timing signals to a pulse generating unit 123. Based on the timing signals supplied from the timing calculating unit 122, the pulse generating unit 123 selects the leading edge and the trailing edge of the modulation/synchronization clock from the group of delayed signals, and generates the modulation/synchronization clock.

The modulation/synchronization clock generated by the clock adjusting unit 120 is supplied to the PWM processing unit 130, and is also supplied to the image data storage unit 200 and the image processing unit 300 in the image forming apparatus shown in FIG. 3.

The modulation/synchronization clock to be generated by the clock adjusting unit 120 is equal to a synchronous clock generated by converting a frequency-modulated clock generated from a reference clock by a frequency modulating unit into a predetermined synchronous state at a synchronizing unit in a conventional signal processing device.

The PWM processing unit 130 refers to the phase data, the frequency modulation coefficient data, the delay amount data, the reference clock, the modulation/synchronization clock, and the image data, and then selects, from the group of delayed signals, the leading edge and the trailing edge of a PWM signal. By doing so, the PWM processing unit 130 generates the PWM signal that has the pulse width corresponding to the value of the image data, is synchronized with a predetermined phase, and is compatible with a predetermined frequency.

At this point, a timing calculating unit 132 determines the leading edge and the trailing edge of the PWM signal by referring to the phase data, the frequency modulation coefficient data, the delay amount data, the reference clock, and the image data, and supplies the leading edge and the trailing edge of the PWM signal as timing signals to a pulse generating unit 133. Based on the timing signals supplied from the timing calculating unit 132, the pulse generating unit 133 selects the leading edge and the trailing edge of the PWM signal from the group of delayed signals, and generates the PWM signal.

As shown in FIG. 3, image data processing to be performed in the image data storage unit 200 and the image processing unit 300 is based on the modulation/synchronization clock. Meanwhile, the PWM processing unit 130 in this embodiment operates with the reference clock, but the group of delayed signals are independent of the modulation/synchronization clock, unlike conventional delayed signals. Therefore, while synchronization is achieved at a synchronizing unit 131 that operates in synchronization with the modulation/synchronization clock, image data is read from outside into the timing calculating unit 132.

As shown in FIG. 3, the PWM signal generated by the PWM processing unit 130 is supplied to the image forming unit 500 of the image forming apparatus, and image formation is then performed.

In the above described structure, the pulse generating unit 123 of the clock adjusting unit 120 uses a selector 123a to select the leading edge of the modulation/synchronization clock from the group of delayed signals and uses a selector 123b to select the trailing edge of the modulation/synchronization clock from the group of delayed signals based on the timing signals supplied from the timing calculating unit 122. An ExOR circuit 123c then generates the pulse of the modulation/synchronization clock based on the selected leading and trailing edges of the modulation/synchronization clock.

In the above described structure, the pulse generating unit 133 of the PWM processing unit 130 uses a selector 133a to select the leading edge of the PWM signal from the group of delayed signals and uses a selector 133b to select the trailing edge of the PWM signal from the group of delayed signals based on the timing signals supplied from the timing calculating unit 132. An ExOR circuit 133c then generates the pulse of the PWM signal based on the selected leading and trailing edges of the PWM signal.

[Operations of the Signal Processing Device and the Image Forming Apparatus, and Procedures According to a Signal Processing Method]

Figure 4:
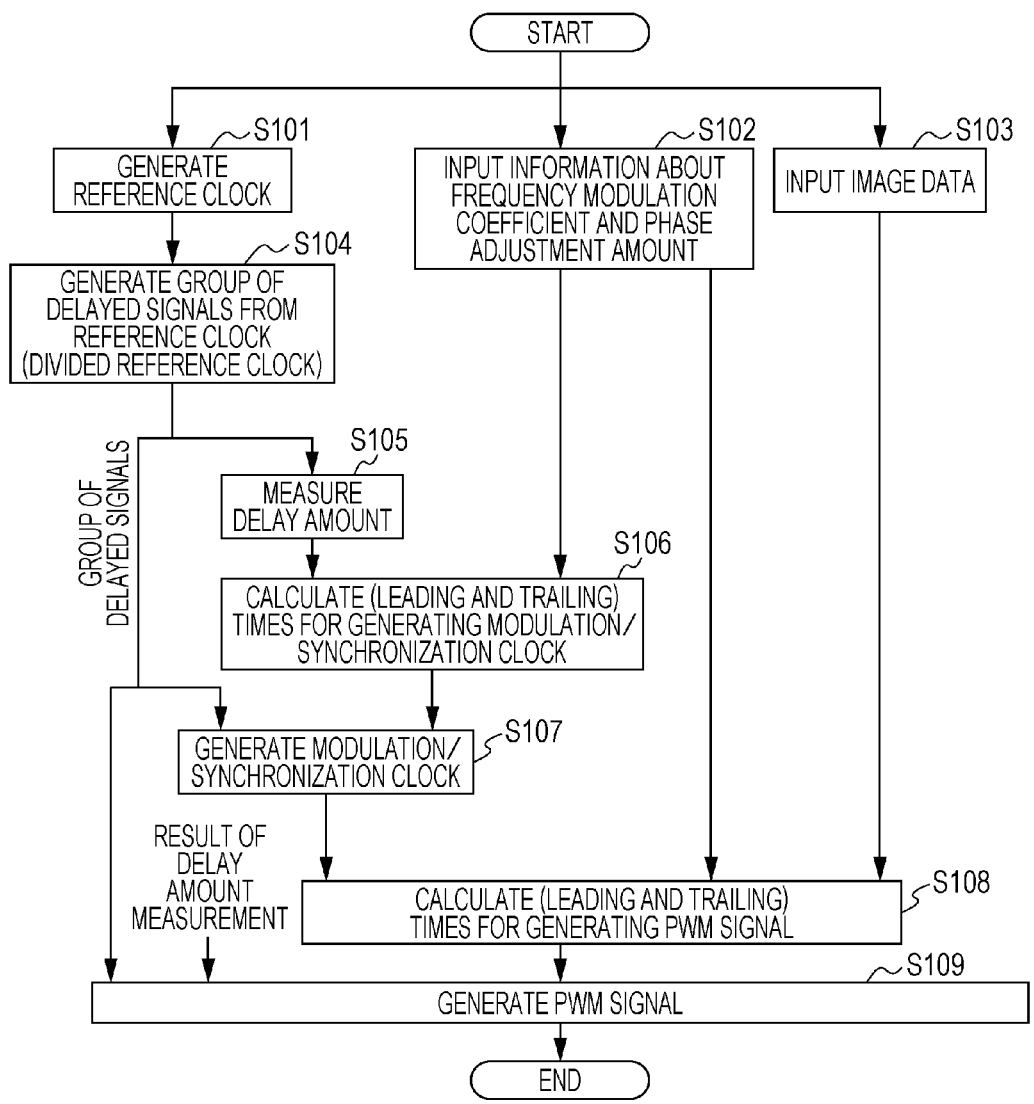
FIG. 4 is a flowchart for explaining an operation according to the embodiment of the present invention.
Figure 5:
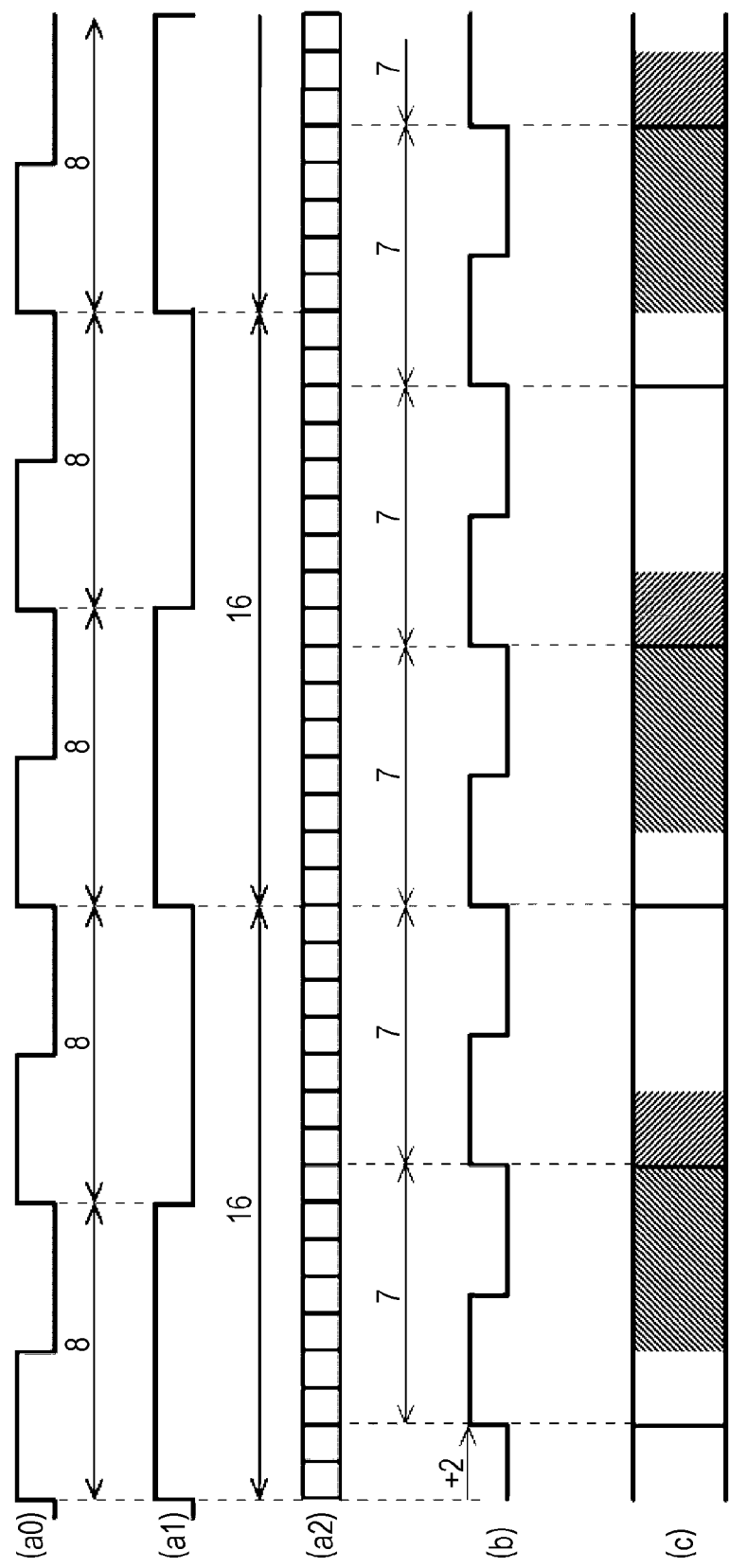
FIG. 5 is a timing chart for explaining operating states of the image forming apparatus according to the embodiment of the present invention.

Referring now to the flowchart shown in FIG. 4 and the timing chart shown in FIG. 5, operation of the signal processing device 100 and operation of the image forming apparatus that includes this signal processing device 100 are described.

The clock generating unit 105 generates the reference clock (reference CLK ((a0) in FIG. 5) at a frequency suitable for forming an image of an originally intended size (step S101 in FIG. 4). Specifically, an image of an originally intended size can be formed by arranging a predetermined number of dots with PWM signals generated with the reference clock (reference CLK) used as the pixel clock.

Here, the clock frequency needs to be adjusted by several percent through adjustment of the size of the images to be formed on the front and back of a paper sheet or partial magnification of images for various kinds of distortion correction or the like. So as to change the clock frequency in view of this, a frequency modulation coefficient is supplied via the control unit 101 (step S102 in FIG. 4). So as to adjust the position of an image on a paper sheet, the clock phase needs to be adjusted in some cases. As the phase data for adjusting the clock phase, sensor data and phase adjustment data are supplied via the control unit 101 (step S102 in FIG. 4). Also, image data is supplied from the image processing unit 300 shown in FIG. 3 or the like to the signal processing device 100 (step S103 in FIG. 4).

Using a divided reference clock ((a1) in FIG. 5) obtained by the dividing unit 111 dividing the reference clock ((a0) in FIG. 5) supplied from the clock generating unit 105 by two, the delayed signal group generating unit 110 generates a group of delayed signals ((a2) in FIG. 5) by minutely delaying the phase of the divided reference clock at the delay element group 112 (step S104 in FIG. 4). For example, in accordance with the required accuracy, the delay element group 112 delays the pulse of one cycle of the divided reference clock by approximately 1/100 stage, to generate the group of delayed signals. Here, the required accuracy is determined in accordance with the degree of adjustment of the frequency or the phase for the modulation/synchronization clock, the stage of adjustment of the pulse width of the PWM signal, and the like.

At the same time as above, the delay amount measuring unit 113 generates delay amount data that indicates the delay time in one stage of the group of delayed signals based on how many stages of the delayed signals are equivalent to one cycle of the reference clock (step S105 in FIG. 4). The delayed signal group generating unit 110 supplies the group of delayed signals and the delay amount data to the clock adjusting unit 120 and the PWM processing unit 130.

In the clock adjusting unit 120, the timing calculating unit 122 refers to the phase data (the sensor data and the phase adjustment data in FIG. 1), the frequency modulation coefficient data, the delay amount data, and the reference clock, and then determines the leading time and the trailing time for generating a modulation/synchronization clock that is at a frequency adjusted based on the frequency modulation coefficient data and is in a phase adjusted based on the phase data (step S106 in FIG. 4). The leading time and the trailing time are then supplied as timing signals to the pulse generating unit 123.

In the clock adjusting unit 120, the pulse generating unit 123 selects the leading edge and the trailing edge of the modulation/synchronization clock from the group of delayed signals ((a2) in FIG. 5) based on the timing signals supplied from the timing calculating unit 122, and generates the modulation/synchronization clock ((b) in FIG. 5) that is at a frequency adjusted based on the frequency modulation coefficient data and is in a phase adjusted based on the phase data (step S107 in FIG. 4).

In the PWM processing unit 130, the timing calculating unit 132 refers to the phase data (the sensor data and the phase adjustment data in FIG. 1), the frequency modulation coefficient data, the delay amount data, the reference clock, and the image data, and then determines the leading time and the trailing time for generating a PWM signal that has a frequency and a phase synchronized with the modulation/synchronization clock and is in a state corresponding to the signal value of the image data (step S108 in FIG. 4). The leading time and the trailing time are then supplied as timing signals to the pulse generating unit 133. Since the image data is read from the image processing unit 300 in synchronization with the modulation/synchronization clock as shown in FIG. 3, the synchronizing unit 131 synchronizes the image data with the modulation/synchronization clock, and this image data is read into the timing calculating unit 132.

As the image data is synchronized with the modulation/synchronization clock at the synchronizing unit 131 in this manner, the PWM processing unit 130 can operate as if in synchronization with the modulation/synchronization clock supplied from the clock adjusting unit 120 (quasi clock conversion), though the clock adjusting unit 120 and the PWM processing unit 130 use the same group of delayed signals and both operate in synchronization with the reference clock.

In the PWM processing unit 130, the pulse generating unit 133 selects the leading edge and the trailing edge of the PWM signal from the group of delayed signals ((a2) in FIG. 5) based on the timing signals supplied from the timing calculating unit 132, and generates the PWM signal ((c) in FIG. 5) that has a pulse width corresponding to the value of the image data and is adjusted to a predetermined frequency while being synchronized with a predetermined phase (step S109 in FIG. 4). Here, the PWM signal shown as (c) in FIG. 5 is generated in a case where the following situation is repeated three times: pixel value=70%, position=right-adjusted, pixel value=30%, and position=left-adjusted.

Figure 7:
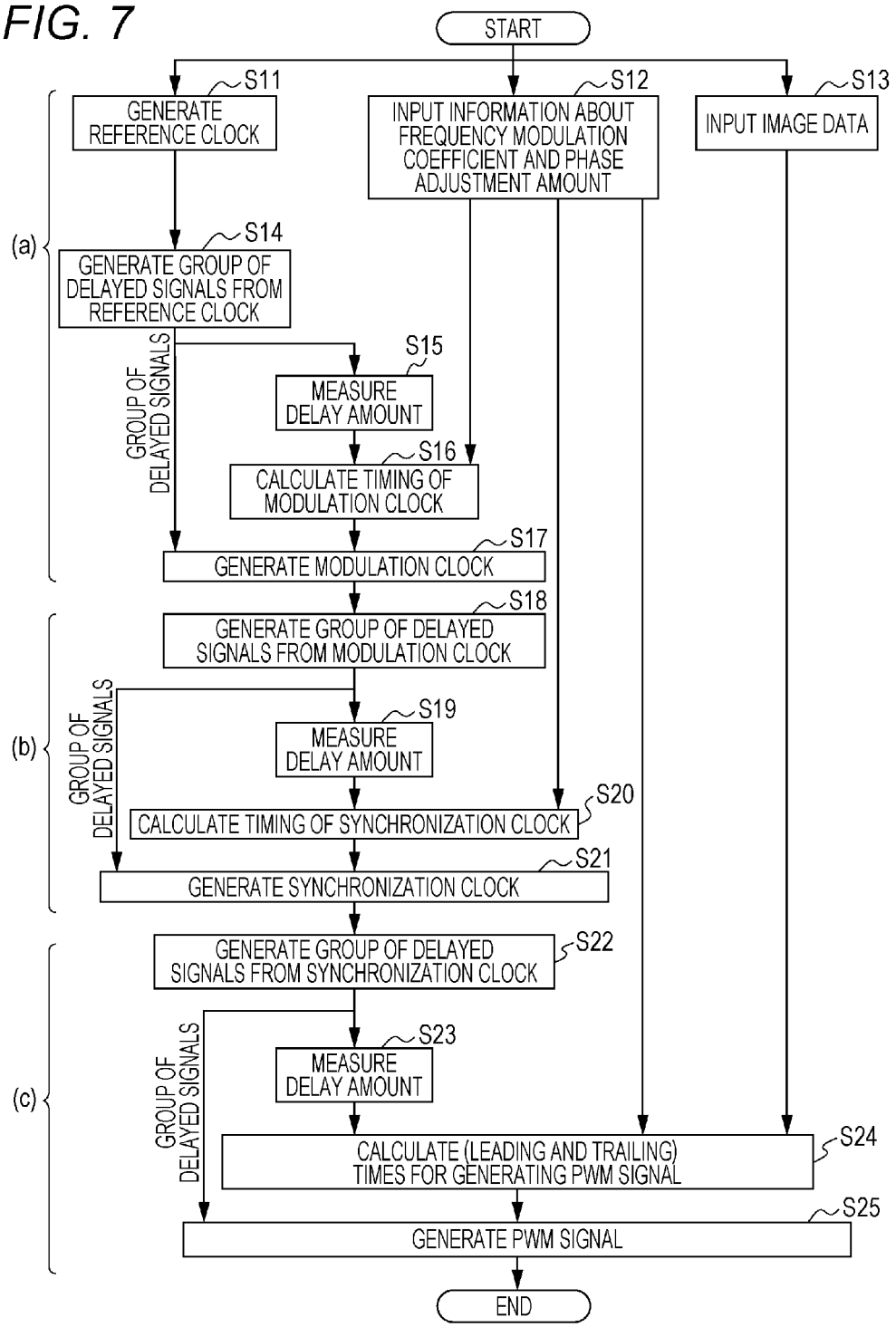
FIG. 7 is a flowchart for explaining signal processing in a conventional image forming apparatus.
Figure 8:
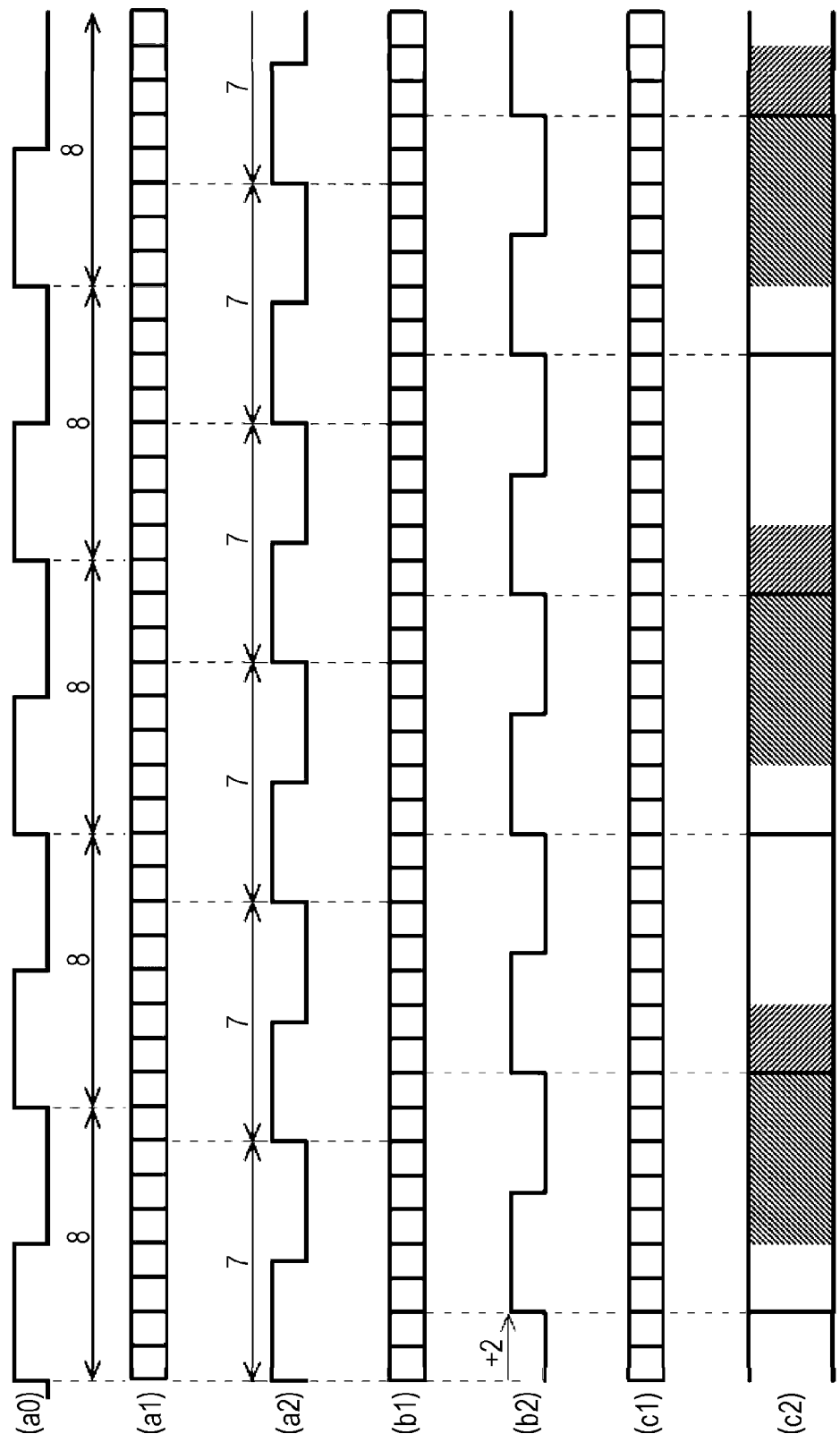
FIG. 8 is a timing chart for explaining signal processing in a conventional image forming apparatus.

In the above operation, the same group of delayed signals obtained from the same group of delayed elements (step S104 in FIG. 4) are used in parallel by the clock adjusting unit 120 generating the modulation/synchronization clock (step S107 in FIG. 4) and the PWM processing unit 130 generating the PWM signal (step S109 in FIG. 4). Therefore, there is no longer the need to generate a group of delayed signals in each process and use stages of delayed signals in series (see steps S14, S18, and S22 in FIG. 7) as in conventional cases. As a result, processing can be simplified, and signal degradation due to accumulation of delay variations included in delayed signals is not caused in this embodiment.

[Effects to be Achieved with the Embodiment]

In the above described structure and operation, the same group of delayed signals ((a2) in FIG. 5) obtained from the same group of delay elements is used in parallel by the clock adjusting unit 120 generating the modulation/synchronization clock ((b) in FIG. 5) and the PWM processing unit 130 generating the PWM signal ((c) in FIG. 5). Accordingly, there is no longer the need to use stages of delayed signals in series as in conventional cases, and signal degradation due to accumulation of delay variations included in delayed signals is not caused.

Figure 6:
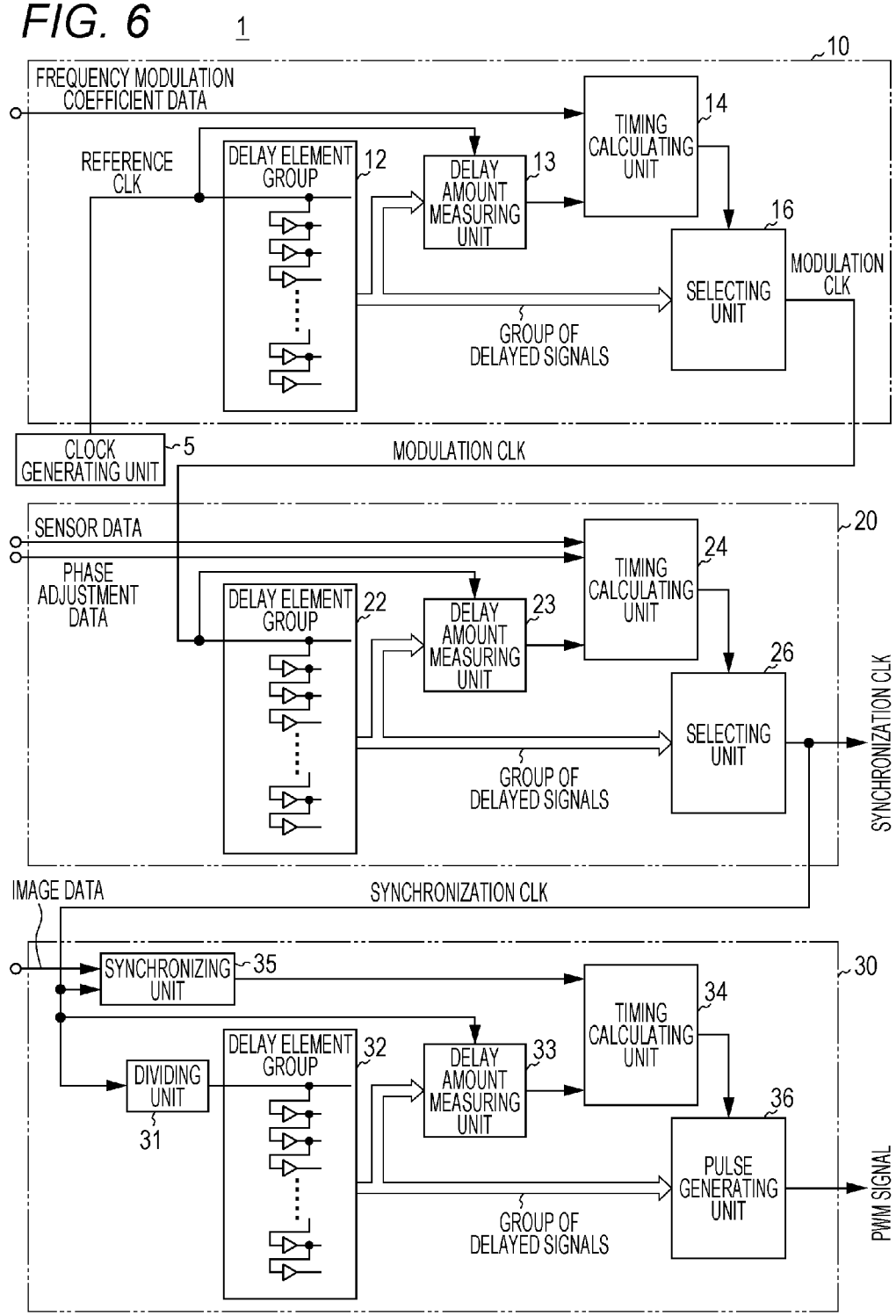
FIG. 6 is a structure diagram illustrating signal processing in a conventional image forming apparatus.

Also, as the entire signal processing device 100 is driven with the same delay element group 112, the circuit size can be made much smaller than that of a conventional signal processing device that requires a group of delay elements for each function (see FIG. 6). Accordingly, in this embodiment, it is easier to cope with high resolution than in conventional cases.

As the clock adjusting unit 120 generates the modulation/synchronization clock by selecting the delayed signals corresponding to the leading edge and the trailing edge of the modulation/synchronization clock from the group of delayed signals, it is possible to obtain a modulation/synchronization clock that has the necessary frequency and phase, without being influenced by delay variations or the like.

Also, as the PWM processing unit 130 generates the PWM signal by selecting the delayed signals corresponding to the leading edge and the trailing edge of the PWM signal from the group of delayed signals, it is possible to obtain a PWM signal of the required pulse width, without being influenced by delay variations or the like.

The delay amount measuring unit 113 generates the delay amount data indicating the delay time in one stage of the group of delayed signals, and the modulation/synchronization clock and the PWM signal are further generated based on the delay amount data. Accordingly, even if there is a change in the delay time of the delayed signals, it is possible to cope with the change in the delay time, and generate a desired modulation/synchronization clock and a desired PWM signal.

Furthermore, as the PWM processing unit 130 generates the PWM signal by referring to the image data synchronized with the modulation/synchronization clock supplied from the clock adjusting unit 120, the PWM processing unit 130 can obtain the PWM signal synchronized with the modulation/synchronization clock generated from the clock adjusting unit 120, using the group of delayed signals generated from the reference clock, instead of a group of delayed signals generated from the modulation/synchronization clock. That is, the same group of delayed signals obtained from the same group of delay elements can be used in generating the modulation/synchronization clock and generating the PWM signal, and signal degradation due to accumulation of delay variations included in delayed signals is not caused.

Furthermore, the delayed signal group generating unit 110 generates the group of delayed signals by dividing the clock and delaying the divided clock with the delay element group 112 including stages of delay elements. The clock adjusting unit 120 generates the modulation/synchronization clock by selecting the delayed signals corresponding to the leading edge and the trailing edge from the group of delayed signals. The PWM processing unit 130 generates the PWM signal by selecting the delayed signals corresponding to the leading edge and the trailing edge from the group of delayed signals. Accordingly, it is possible to generate an appropriate modulation/synchronization clock and an appropriate PWM signal, without being influenced by delay variations or the like.

Furthermore, as the image forming apparatus includes the above described signal processing device 100 and the image forming unit 500 that forms an image by using the PWM signal generated by the signal processing device 100, the image forming apparatus generates the modulation/synchronization clock and the PWM signal by using the same group of delayed signals obtained from the same group of delay elements. Accordingly, it is possible to perform image formation, without image quality deterioration due to accumulation of delay variations included in delayed signals or the like.

[Other Embodiments]

The above embodiment has been described on the assumption that the signal processing device 100 is applied to image formation, but the present invention is not limited to that. For example, with the image data being replaced with digital data, it is possible to apply the signal processing device 100 to various kinds of signal processing using a PWM signal. In a case where the signal processing device 100 is used in an apparatus that converts digital data of an audio signal to a PWM signal, for example, there is no accumulation of delay variations, and accordingly, higher sound quality can be achieved.

Although one PWM signal is generated in the range of one clock pulse in the above embodiment as shown by (c) in FIG. 5, the present invention is not limited to that. For example, it is possible to generate two PWM signals in the range of one clock pulse by preparing two pulse generating units 133 each including the selectors 133a and 133b and the ExOR circuit 133c, and generating the corresponding timing signals at the timing calculating unit 132. The same applies to the clock adjusting unit 120.

According to an embodiment of the present invention, the effects described below can be achieved.

(1) When an output signal in accordance with image data is generated with a clock corresponding to the pixels of the image data, a group of delayed signals is generated with a delay element group formed with stages of delay elements, the delay element group delaying the clock in stages within the time equivalent to one pulse of the clock. A modulation/synchronization clock is generated from the group of delayed signals based on phase data matching the clock with a predetermined phase and frequency modulation coefficient data converting the clock to a predetermined frequency, the modulation/synchronization clock having its frequency and its synchronization state adjusted. A PWM signal is generated from the group of delayed signals based on the phase data, the frequency modulation coefficient data, the modulation/synchronization clock, and the image data, the PWM signal having the pulse width corresponding to the value of the image data and being adjusted to the predetermined frequency while being synchronized with the predetermined phase.

That is, the same group of delayed signals obtained from the same group of delay elements is used in generating the modulation/synchronization clock and generating the PWM signal. Accordingly signal degradation due to accumulation of delay variations included in delayed signals is not caused.

(2) In Item. 1, the clock adjusting unit generates the modulation/synchronization clock by selecting the delayed signals corresponding to the leading edge and the trailing edge of the modulation/synchronization clock from the group of delayed signals, it is possible to obtain a modulation/synchronization clock that has the necessary frequency and phase, without being influenced by delay variations or the like. Also, as the PWM processing unit generates the PWM signal by selecting the delayed signals corresponding to the leading edge and the trailing edge of the PWM signal from the group of delayed signals, it is possible to obtain a PWM signal of the required pulse width, without being influenced by delay variations or the like.

(3) In Items. 1 to 2, the modulation/synchronization clock and the PWM signal are preferably generated based further on the delay amount data indicating the delay time in one stage of the group of delayed signals. Accordingly, even if there is a change in the delay time of the delayed signals, it is possible to cope with the change in the delay time, and generate a desired modulation/synchronization clock and a desired PWM signal.

(4) In Items. 1 to 3, the PWM signal is generated in accordance with the image data synchronized with the modulation/synchronization clock. Accordingly, the PWM processing unit can generate the PWM signal synchronized with the modulation/synchronization clock, using the group of delayed signals generated from the reference clock, instead of a group of delayed signals generated from the modulation/synchronization clock. That is, the same group of delayed signals obtained from the same group of delay elements can be used in generating the modulation/synchronization clock and generating the PWM signal, and signal degradation due to accumulation of delay variations included in delayed signals is not caused.

(5) In Items. 1 to 4, the delayed signal group generating unit generates the group of delayed signals by dividing the clock and delaying the divided clock with the delay element group including stages of delay elements, and the modulation/synchronization clock and the PWM signal are generated by selecting the delayed signals corresponding to the leading edge and the trailing edge from the group of delayed signals. Accordingly, it is possible to generate an appropriate modulation/synchronization clock and an appropriate PWM signal, without being influenced by delay variations or the like.

(6) The image forming apparatus includes the above described signal processing device of any one of Items. 1 to 5 and the image forming unit that forms an image by using the PWM signal generated by the signal processing device. The image forming apparatus generates the modulation/synchronization clock and the PWM signal by using the same group of delayed signals obtained from the same group of delay elements. Accordingly, it is possible to perform image formation, without image quality deterioration due to accumulation of delay variations included in delayed signals or the like.

Although the present invention has been described and illustrated in detail, it is clearly understood that the same is by way of illustrated and example only and is not to be taken by way of limitation, the scope of the present invention being interpreted by terms of the appended claims.

What is claimed is:

1. A signal processing device that generates an output signal in accordance with image data, using a clock corresponding to pixels of the image data, the signal processing device comprising:

a delayed signal group generator configured to generate a group of delayed signals with a delay element group formed with a plurality of stages of delay elements, the delay element group delaying the clock in a plurality of stages within a time equivalent to one pulse of the clock;

a clock adjuster configured to generate a modulation/synchronization clock from the group of delayed signals by referring to i) phase data matching the clock with a predetermined phase, and ii) frequency modulation coefficient data converting the clock to a predetermined frequency, the modulation/synchronization clock having a frequency and a synchronization state adjusted; and a PWM processor configured to generate a PWM signal from the group of delayed signals which are the same as the group of delayed signals used for generating the modulation/synchronization clock by referring to the phase data, the frequency modulation coefficient data, the modulation/synchronization clock, and the image data, the PWM signal having a pulse width corresponding to a value of the image data and being adjusted to the predetermined frequency while being synchronized with the predetermined phase, wherein:

the delayed signal group generator generates delay amount data indicating a delay time equivalent to one stage of the group of delayed signals based on how many stages of the group of delayed signals are equivalent to one cycle of the clock, and supplies the delay amount data together with the group of delayed signals to the clock adjuster and the PWM processor, the clock adjuster selects desired delayed signals from the group of delayed signals and generates the modulation/synchronization clock by further referring to the delay amount data, and the PWM processor selects desired delayed signals from the group of delayed signals and generates the PWM signal by further referring to the delay amount data.

2. The signal processing device according to claim 1, wherein:

the clock adjuster generates the modulation/synchronization clock by selecting delayed signals corresponding to a leading edge and a trailing edge of the modulation/synchronization clock from the group of delayed signals, and the PWM processor generates the PWM signal by selecting delayed signals corresponding to a leading edge and a trailing edge of the PWM signal from the group of delayed signals.

3. The signal processing device according to claim 1, wherein the PWM processor generates the PWM signal by referring to the image data synchronized with the modulation/synchronization clock.

4. The signal processing device according to claim 1, wherein the delayed signal group generator generates the group of delayed signals by dividing the clock and delaying the divided clock with the delay element group including the plurality of stages of delay elements.

5. An image forming apparatus comprising:
the signal processing device according to claim 1; and
an image forming unit configured to form an image using the PWM signal generated by the signal processing device.

6. A signal processing method for generating an output signal in accordance with image data, using a clock corresponding to pixels of the image data,
the signal processing method comprising:
generating a group of delayed signals with a delay element group formed with a plurality of stages of delay elements, the delay element group delaying the clock in a plurality of stages within a time equivalent to one pulse of the clock;
generating a modulation/synchronization clock from the group of delayed signals by referring to i) phase data matching the clock with a predetermined phase and ii) frequency modulation coefficient data converting the clock to a predetermined frequency, the modulation/synchronization clock having a frequency and a synchronization state adjusted; and
generating a PWM signal from the group of delayed signals which is the same as the group of delayed signals used for generating the modulation/synchronization clock by referring to the phase data, the frequency modulation coefficient data, the modulation/synchronization clock, and the image data, the PWM signal having a pulse width corresponding to a value of the image data and being adjusted to the predetermined frequency while being synchronized with the predetermined phase,
wherein:
generating the group of delayed signals includes generating delay amount data indicating a delay time equivalent to one stage of the group of delayed signals based on how many stages of the group of delayed signals are equivalent to one cycle of the clock,
generating the modulation/synchronization clock includes selecting desired delayed signals from the group of delayed signals and generating the modulation/synchronization clock by further referring to the delay amount data, and
generating the PWM signal includes selecting desired delayed signals from the group of delayed signals and generating the PWM signal by further referring to the delay amount data.

7. The signal processing method according to claim 6, wherein:
generating the modulation/synchronization clock comprises selecting delayed signals corresponding to a leading edge and a trailing edge of the modulation/synchronization clock from the group of delayed signals, and
generating the PWM signal comprises selecting delayed signals corresponding to a leading edge and a trailing edge of the PWM signal from the group of delayed signals.

8. The signal processing method according to claim 6, wherein generating the PWM signal includes generating the PWM signal by referring to the image data synchronized with the modulation/synchronization clock.

9. The signal processing method according to claim 6, wherein generating the group of delayed signals includes generating the group of delayed signals by dividing the clock and delaying the divided clock with the delay element group including the plurality of stages of delay elements.

* * * * *